(12) United States Patent
Servin et al.

(10) Patent No.: US 7,550,970 B2
(45) Date of Patent: Jun. 23, 2009

(54) MULTIDIMENSIONAL NMR SPECTROSCOPY OF A HYPERPOLARIZED SAMPLE

(75) Inventors: Rolf Servin, Malmo (SE); Jan Henrik Ardenkjaer-Larsen, Malmo (SE); Haukur Johannesson, Malmo (SE); Maurice Goldman, Villebon sur Yvette (FR); Jan Wolber, Amersham (GB)

(73) Assignee: GE Healthcare AS, Oslo (NO)

( * ) Notice: Subject to any disclaimer, the term of this patent is extended or adjusted under 35 U.S.C. 154(b) by 0 days.

(21) Appl. No.: 10/553,381

(22) PCT Filed: Apr. 13, 2004

(86) PCT No.: PCT/EP2004/003864

§ 371 (c)(1),
(2), (4) Date: Jul. 19, 2007

(87) PCT Pub. No.: WO2004/090563

PCT Pub. Date: Oct. 21, 2004

(65) Prior Publication Data

US 2008/0061781 A1 Mar. 13, 2008

(30) Foreign Application Priority Data

Apr. 14, 2003 (GB) ................................. 0308586.7

(51) Int. Cl.
*G01V 3/00* (2006.01)
(52) U.S. Cl. ...................................... 324/307; 324/309
(58) Field of Classification Search .................. 324/307, 324/309
See application file for complete search history.

(56) References Cited

U.S. PATENT DOCUMENTS

| 4,685,106 A | 8/1987 | Miller et al. |
| 5,189,370 A | 2/1993 | Kolem et al. |
| 6,696,040 B2 * | 2/2004 | Driehuys .................... 424/9.3 |
| 7,106,060 B2 * | 9/2006 | Hennig ........................ 324/309 |

(Continued)

FOREIGN PATENT DOCUMENTS

WO 00/40988 7/2000

(Continued)

OTHER PUBLICATIONS

Bajaj, V.S., et.al. "Dynamic Nuclear Polarization at 9T Using a Novel 250Ghz Gyrtron Microwave Source" Journal of Magnetic Resonance, Academic Press, Orlando, FL, vol. 160, No. 2 Feb. 2003, pp. 85-90.

(Continued)

*Primary Examiner*—Louis M Arana
(74) *Attorney, Agent, or Firm*—Robert F. Chisholm

(57) ABSTRACT

The present invention relates to methods of performing Nuclear Magnetic Resonance (NMR) spectroscopy adapted for a hyperpolarized sample. The methods comprise the steps of hyperpolarizing a sample using DNP, wherein at least a portion of the NMR active nuclei receives hyperpolarization; performing NMR spectroscopy on the sample with the use of sequences of rf-pulses, wherein the pulse sequences comprises at least two rf-pulses, either on the same nuclei or on different nuclei, and wherein the pulse sequence is adapted for a hyperpolarized sample; and analyzing at least two of the NMR spectra to obtain a characterization of the sample, or to obtain an interim result to be used in the NMR spectroscopy step.

6 Claims, 4 Drawing Sheets

U.S. PATENT DOCUMENTS

| | | | |
|---|---|---|---|
| 2001/0041834 A1 | | 11/2001 | Mugler et al. |
| 2002/0006382 A1 | | 1/2002 | Driehuys et al. |
| 2008/0100293 A1* | | 5/2008 | Lucas et al. ................. 324/307 |

FOREIGN PATENT DOCUMENTS

| | | |
|---|---|---|
| WO | 01/67955 | 9/2001 |
| WO | 01/96895 | 12/2001 |
| WO | 2004/011899 | 2/2004 |

OTHER PUBLICATIONS

Wind, R.A. et.al., "Solid Materials Research with NMR and Dynamic Nuclear Polarization Spectroscopy" Advance in Chemistry Series, American Chemical Society, Washington, DC, vol. 229, 1993 pp. 45-63.

Lycon, CE, et.al., "Two-dimensional 15N-1H Photo-DICNP as a Surface Probe of Native and Partially Structured Proteins" Journal of American Chemical Society, American Chemical Society, Washington, DC, vol. 121, 1999 pp. 6505-6506.

Zhao, L., et.al. "Hyperpolarized 129Xe T2 and Diffusion Measurements for Fast Spin-Echo MRI" Proceedings of the International Society for Magnetic Resonance in Medicine, 6yh Scientific Meeting and Exhibition, Sydney, Australia, Apr. 18-24, 1998, p. 451.

Sobering, GS, et.al., "Optimization of Acquisition Parameters for Multi-Shot Hyper-Polarized NMR: Variable Flip Angle Excitation" Proceedings of the Society of magnetic Resonance $3^{rd}$. Scientific Meeting and Exhibition and the European Society for Magnetic Resonance in medicine and Biology $12^{th}$. Annual Meeting and Exhibition (Held Jointl), Nice, Aug. 19-25, 1995 p. 687.

Frydman, L., et.al., "Non-Cartesian Sampling schemes and the Acquisition of 2D NMR Correlation Spectra from Single-Scan Experiments" Chemical Physics Letters, vol. 220, 1994 pp. 371-377.

Int'l Search Report and Written opinion for PCT/EP2004/003864 dated Aug. 2004.

Int'l Preliminary Examination Report for PCT/EP2004/003864 dated Mar. 2005.

GB 0308586.7 Search Report dated Jan. 2004.

\* cited by examiner

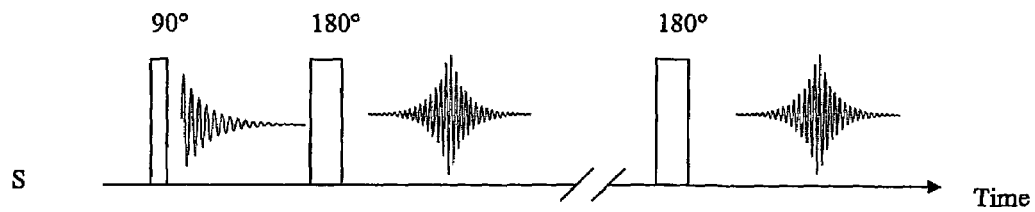
*Fig. 2a*
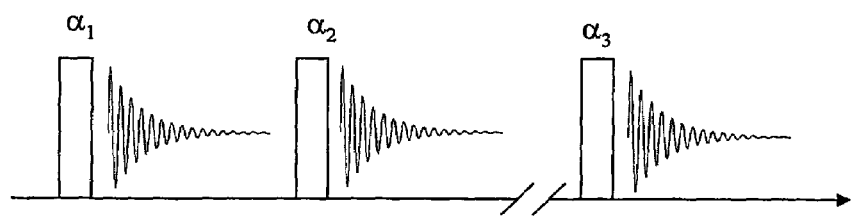
*Fig. 2b*
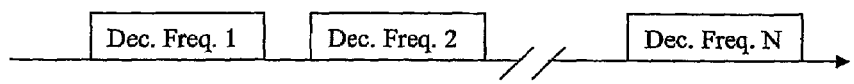

US 7,550,970 B2

MULTIDIMENSIONAL NMR SPECTROSCOPY OF A HYPERPOLARIZED SAMPLE

This application is a filing under 35 U.S.C. 371 of international application number PCT/EP2004/003864, filed Apr. 13, 2004, which claims priority to application number 0308586.7 filed Apr. 14, 2003, in Great Britain the entire disclosure of which is hereby incorporated by reference.

FIELD OF THE INVENTION

The present invention relates to methods and arrangements in Nuclear Magnetic Resonance (NMR) spectroscopy, and in particularly for methods utilizing NMR spectroscopy adapted for a sample which is hyperpolarized in order to enhance the strength of the NMR signal.

BACKGROUND OF THE INVENTION

Nuclear magnetic Resonance (NMR) is an analytical technique that has seen a dramatic increase in use and development over the past few decades. The use reaches into diverse areas such as structural biology, pharmaceutics, metabolic studies, solid state chemistry, condensed matter physics, rheology and medical applications. In the latter case NMR is often used as a non-invasive imaging method, referred to as Magnetic Resonance Imaging (MRI). Advanced mathematical and physical methods, e.g. Fourier Transform (FT) and multidimensional analysis, have been incorporated into the NMR analysis methods in order to increase its usefulness and to be able to explore novel areas.

For the resonance phenomena, which is the basis of NMR and MRI, to occur, isotopes with non-zero nuclear spin have to be present. These will be referred to as NMR active nuclei in the present application. Since NMR is not a very sensitive technique, a relatively high concentration and/or a high gyromagnetic ratio is needed, especially for imaging purposes or more advanced NMR analysis e.g. two-dimensional (2D) NMR. Major attention has been given to the problem of the relatively low sensitivity of the NMR technique. Significant improvements have been achieved by the introduction of techniques for hyperpolarization of a sample, or in the case of MRI, the use of hyperpolarized contrast agents. The term hyperpolarization here refers to that non-zero spin nuclei intended to be used in the NMR analysis have been given a nuclear spin polarization, i.e., the population difference between the ground and excited states is greater than in the equilibrium distribution.

Hyperpolarization may be achieved by a number of methods known in the art. Particularly interesting methods utilize Dynamical Nuclear Polarization (DNP) through electronic spins. Such methods are disclosed in for example WO 99/35508 and WO 01/96895, by the same applicant as in the present patent application. DNP mechanisms include the Overhauser effect, the so-called solid effect and thermal mixing effect. The Overhauser effect is a relaxation driven process that occurs when the electron-nucleus interaction is time-dependent (due to thermal motion or relaxation effects) on the time scale of the inverse electron Larmor frequency or shorter, and when the electronic spins are saturated by a strong microwave irradiation. Electron-nuclear cross-relaxation results in an exchange of energy with the lattice giving rise to an enhanced nuclear polarisation. The overall enhancement depends on the relative strength of the scalar and dipolar electron-nuclear interaction and the microwave power. For static systems both thermal mixing and the solid effect are operative. In the solid effect, the electron spin system is irradiated at a frequency that corresponds to the sum or difference of the electronic and nuclear Larmor frequencies. The nuclear Zeeman reservoir absorbs or emits the energy difference and its spin temperature is modified, resulting in an enhanced nuclear polarisation. The efficiency depends on the transition probabilities of otherwise forbidden transitions that are allowed due to the mixing of nuclear states by non-secular terms of the electron-nuclear dipolar interaction. Thermal mixing arises when the electron-electron dipolar reservoir establishes thermal contact with the nuclear Zeeman reservoir. This takes place when the characteristic electronic resonance line width is of the order of the nuclear Larmor frequency. Off resonance irradiation of the electronic spins results in a cooling of the electronic spin-spin-thermal reservoir and, through thermal contact of the latter with the nuclear Zeeman energy reservoir via the electron-nuclei interactions, the nuclear polarization is enhanced. For thermal mixing both the forbidden and the allowed transitions can be involved.

The method of hyperpolarization, or in the case of MRI, the use of a hyperpolarised contrast agent, has been shown to dramatically enhance the signal recorded in the NMR analysis. This has been utilized in performing measurements that has not been possible with non-hyperpolarized samples, to lower the amount of sample needed for the analysis and to, in certain applications, dramatically shorten the measurement time needed for an analysis.

Thus, hyperpolarization, through DNP or other methods, offers a way of improving the sensitivity of NMR applications. However, the hyperpolarization does put certain requirements on how the sample is treated and how the NMR spectroscopy is performed.

One requirement arises from the condition that the hyperpolarization represent a highly non-equilibrium thermodynamic state, i.e. a hyperpolarized sample is not in thermal equilibrium.

This will cause a relaxation of the spin system towards the thermal equilibrium through a longitudinal relaxation, characterized by a parameter, $T_1$, the longitudinal relaxation time. This is a recognized problem and measures may be taken to choose NMR active nuclei with a comparably long $T_1$ and to further reduce the relaxation rate, for example, as taught in WO 0196895, by the same applicant as the present invention. Even if such known measures are taken, it is of highest importance to perform the NMR analysis immediately, or as soon as possible, after the hyperpolarization. This is addressed by the applications WO 0237132 and WO 0236005, by the same applicant, and are hereby incorporated by reference. In addition the NMR analysis must be relatively quick in order to be able to be performed within the relaxation time $T_1$ of the NMR active nuclei. This is a problem in more advanced uses of NMR, for example 2D NMR and diffusion studies, wherein the NMR spectroscopy of the known methods typically takes too long to be used for a hyperpolarized sample. This is illustrated in that a standard 2D NMR study can take hours to perform, while the hyperpolarization at ambient temperature typically has a much shorter relaxation time than that.

Comparably rapid advanced NMR methods have recently been suggested, for example as described in "The acquisition of multidimensional NMR spectra within a single scan" by L. Frydman et al, Prac. Natl. Acad. Sci., 99:15858-62, Dec. 10, 2002. These methods represent major improvements regarding measurement time, but have the drawback of poor signal-to-noise ratios.

A further requirement when using hyperpolarized sample arises from the fact that the rf-pulses typically used in the NMR spectroscopy themselves affect the hyperpolarization. Many known sequences, will, if used on a hyperpolarized sample, not be able to make use of the increased signal strength possibly afforded by the hyperpolarization.

The requirements associated with the use of hyperpolarized samples maybe summarized as:
- the time constraints given by the longitudinal relaxation time, require a fast NMR analysis; and
- the NMR spectroscopy must be designed to avoid erasing information afforded by the hyperpolarization of the sample.

None of the prior art methods meet these requirements.

SUMMARY OF THE INVENTION

The objective problem is to provide a method of NMR spectroscopy that uses pulse sequences that effectively make use of the increased signal strength afforded by a hyperpolarized sample, especially a sample hyperpolarized with a DNP method.

The problem is solved by the methods as defined in the independent claim. Further improved methods have the features mentioned in the dependent claims.

The method of performing Nuclear Magnetic Resonance (NMR) spectroscopy according to the invention comprises the steps of: hyperpolarizing a sample using DNP, wherein the NMR active nuclei receive hyperpolarization; performing NMR spectroscopy on the sample with the use of sequences of rf-pulses, wherein the pulse sequences comprises at least two rf-pulses, either on the same nuclei or on different nuclei, and wherein the pulse sequence is adapted for a hyperpolarized sample, whereby at least two NMR spectra are producable; and analysing at least two of the NMR spectra to obtain a characterization of the sample, or to obtain an interim result to be used in the NMR spectroscopy step.

In one embodiment of the invention the pulse sequence is adapted to the hyperpolarized sample by using a single scan pulse sequence in which one initial 90° pulse is followed by a plurality of spin echo pulses.

In another embodiment of the invention the pulse sequence is adapted to the hyperpolarized sample by using repeated excitation pulses with small flip angles in order to maintain at least a portion of the hyperpolarization after the initial excitation pulse.

In further embodiment of the invention the method is adapted for multidimensional NMR spectroscopy, and the method comprises: a pulse sequence which comprises pulses followed by evolution periods, enabling a mapping of a multidimensional time-space grid, in which the time parameters are modulated by different coupling constants, and a subsequent analysis of the multidimensional time domain data, which analysis comprises a transformation to frequency domain data.

BRIEF DESCRIPTION OF THE FIGURES

The features and advantages of the present invention outlined above are described more fully below in the detailed description in conjunction with the drawings where like reference numerals refer to like elements throughout, in which:

FIG. 2a-b is a schematic illustration of a pulse sequence according to a second embodiment of the present invention;

DETAILED DESCRIPTION OF THE INVENTION

Figure 1A:
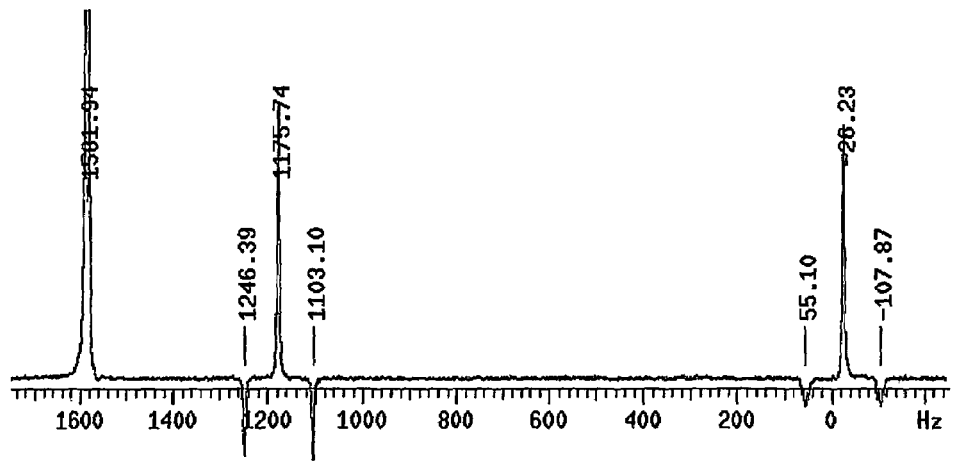
FIG. 1a-b shows examples of NMR spectra obtained in a first embodiment of the present invention.

Embodiments of the invention will now be described with reference to the figures.

The methods according to the present invention are suitable for in vitro studies of a wide range of samples, including, but, not limited to, the studies of organic molecules, such as proteins. With methods according to the invention the sample may be characterized in a variety of ways, including but, not limited to, for example, structural analysis of the molecule, measurement of diffusion coefficients and measurement of dynamic properties.

The sample must contain nuclei suitable for NMR, i.e. nuclei with non-zero nuclear spin, here referred to as NMR active nuclei. Examples of such nuclei comprise $^{13}C$, $^{15}N$, $^{31}P$, $^{19}F$ and/or $^{1}H$. In addition the nuclei should be suitable for the hyperpolarization process, in particular processes according to DNP. $^{13}C$ and $^{15}N$ are particularly suitable and $^{13}C$ the most preferred. Some of the suitable nuclei have a natural abundance, which in certain application will suffice for the NMR spectroscopy, for example $^{13}C$ (1.1%). In other applications it may be advantageous to enrich the sample with suitable NMR active nuclei. Methods of enriching a sample with for example $^{13}C$ are known in the art. A sample may contain more than one type of NMR active nuclei.

In the embodiments of the present invention the notations defining angles of the applied fields refer to a rotating frame and are the notations commonly used in the discipline of NMR. The phrases "pulse on carbon", "pulse on hydrogen" etc should be understood as a radio frequency pulse (rf-pulse) with the frequency adapted to the nucleus and the stationary field as to correspond to the Larmor frequency of the nucleus. As appreciated by those skilled in the art certain variation in angles, frequencies and pulse duration are acceptable and commonly experienced in measurement equipments. Hence, terms such as "90° pulse" should be interpreted as a pulse given the physical effects on the spin system commonly associated with such a pulse.

As stated above, and in contrast to the prior art methods, an effective method of NMR spectroscopy utilizing hyperpolarized samples must be designed to meet the requirements imposed by the hyperpolarization. The methods according to the invention are carefully adapted to meet these requirements and to fully take advantage of the enhancement in signal strength afforded by the hyperpolarization.

The methods according to the present invention comprise the main steps of:

a) hyperpolarizing a sample with DNP, wherein the NMR active nuclei receive hyperpolarization, and transformation of the sample to a liquid state, for example by melting or dissolution;

b) performing NMR spectroscopy on the sample with the use of sequences of rf-pulses, wherein the pulse sequences comprises at least two rf-pulses on the same nuclei, or on different nuclei, and wherein the pulse sequence is adapted for a hyperpolarized sample leading to a plurality of NMR spectra being produced.

c) analysing at least two of the NMR spectra to obtain a characterization of the sample, or an interim result to be used in the NMR spectroscopy or a combination of other interim results to provided a characterization of the sample.

The step of hyperpolarization (a) may be performed with any known, or future, method of hyperpolarization based on DNP suitable for solid samples. Such methods are disclosed in for example WO 99/35508 and WO 01/96895 and in references therein.

The second main step (b) comprising NMR spectroscopy is the step where care must be taken to fulfil the above stated requirements imposed by the hyperpolarization. Many prior art pulse sequences use a plurality of 90° pulses and subsequent waiting periods to allow for remagnetization and acquisition. The 90° pulses typically flip all magnetisation vectors into the transverse plane, and prior art sequences using more than one 90° pulse can not be used for hyperpolarized samples. The method according to the invention address this problem either by using a single scan (one shot) pulse sequence in which as much information as possible is extracted after an initial pulse by the use of spin echo pulse(s), or by using repeated pulses with small flip angles in order to maintain as much of the longitudinal hyperpolarization as possible during the spectroscopy. Which of the two alternatives that is to be used is determined by the intended use of the measurement and the characteristics of the sample. As will be illustrated in the embodiments described below, it is not only the initial "flip"-pulse of a pulse sequence that should be adapted for the conditions set by the hyperpolarised sample, typically the complete sequence should be modified compared to standard sequences in order to fully utilize the hyperpolarization.

As previously discussed it is of importance not only to keep the time for the actual measurement as short as possible, but also to reduce as much as possible the time between the hyperpolarization of the sample and the taking of the measurements by NMR spectroscopy. WO 0237132 and WO 0236005, by the same applicant as the present invention, teaches methods of extremely rapid dissolution and melting, respectively, of a hyperpolarized sample. A material (sample) is polarized in a strong magnetic field in a cryostat and brought in solution, or alternatively melted, while still in the cryostat. Disclosed is also a method and apparatus, wherein the hyperpolarization and the NMR spectroscopy is performed in the same apparatus, and partly utilising the same equipment within the apparatus, such as rf-coils. WO 0237132 and WO 0236005 are hereby included in the present application by reference. The method of melting a sample is of particular interest for the present application. Taught in WO 0236005 are methods of melting including using a diode laser for heating and hence melting the sample, bringing the sample into thermal contact with a comparably warm liquid, and by the use of an electrical heat element. In order to preserve as much of the hyperpolarization as possible it is of importance that the melting happens on the timescale of $T_1$. The process may also include by the following methods and arrangements, or combinations thereof:

A loop-gap resonator can be used for heating the sample. This allows the sample to be put at maximum E-field or maximum B-field at choice;
  The microwave resonant structure can be used for both the DNP process and the melting;
  There can be a transport of the sample from the DNP enhancement position to the melting position within the same cryostat;
  The sample could have a conductive surface to increase losses from currents;
  Absorbing dyes could be added to the sample;
  A violent exothermic chemical reaction could be used to generate heat for melting;
  Melting and dissolution could be combined. This could be advantageous in a dissolution situation;
  Mirrors could be used to guide the light;
  At high pressure the solid will become liquid;
  Focused light could be used (not necessarily a laser) for heating;
  Resistive heating through magneto- or electrostatic energy storage;
  Melting by welding (electrostatic discharge);
  Moving the cold sample into warm area to provide heating;
  Focused ultrasound as source of heat;
  Nuclear energy as source of heat;
  Temperature control could be used to maintain stable temperature;
  Melting enables repetition of the experiment for e.g. 2D experiments.

The method according to the present invention comprising the above-described main steps may be adapted in a large variety of ways to characterize the hyperpolarized sample in different aspects. Such variations include, but are not limited to, heteronuclear J-coupling correlation spectroscopy, heteronuclear shift correlation spectroscopy, diffusion-weighted spectroscopy. These spectroscopy methods are used to determine for example: connectivity between coupled nuclei, scalar coupling (J-coupling) between nuclei, reveal structural information about the molecules in the sample and to determine diffusion coefficients. Embodiments of the present invention exemplifying these analysis methods will be given below.

Figure 1B:
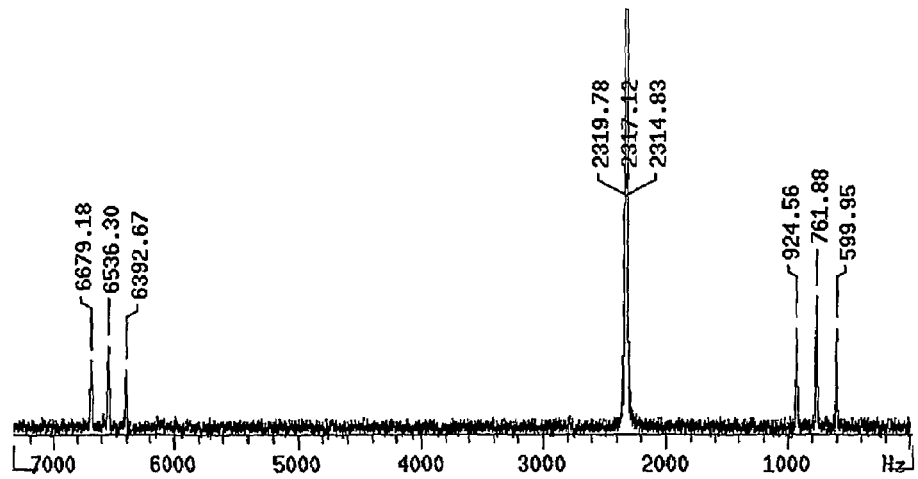

Heteronuclear J-coupling Correlation Spectroscopy for Hyperpolarized Samples, Using 1D Spectra of Each Spin Species In a first embodiment, described with reference to FIGS. 1a-b, the method according to the invention is adapted for heteronuclear J-coupling correlation spectroscopy, using a 1D NMR spectra for each NMR active nuclear species in the sample.

This embodiment of the invention relates to the problem of correlating heteronuclei by their scalar (J) coupling. Using hyperpolarized samples, ordinary NMR techniques are not applicable for in vitro heteronuclear shift correlation spectroscopy, for the reasons stated above. Of special interest is to correlate couplings between $^1H$ and $^{13}C$, and this embodiment will be described with $^1H$ and $^{13}C$ as a non-limiting example. Other couplings, e.g. between $^1H$ and $^{15}N$, are equally well able to be studied. It is further assumed that the $^{13}C$ nuclei are not enriched, i.e. their abundance is that which is naturally occurring (i.e. 1.1%).

The nuclear spins are first hyperpolarized in the solid state by using a suitable method, e.g. DNP. After dissolution/melting, two one-dimensional (1D) spectra are recorded, one for each of the two nuclear spin species $^1H$ and $^{13}C$, which is depicted in FIG. 1a-b. Observed in the $^1H$ spectrum (FIG. 1a) are: a superposition of singlet peaks arising from molecules lacking $^{13}C$, and doublets, symmetric about the singlet, that arise from the remaining molecules (1.1%). The splitting of the doublet is equal to the scalar coupling, $J_{CH}$, between $^1H$ and $^{13}C$. In the 13C spectrum (FIG. 1b) the resonances are split into n+1 peaks by a scalar coupling with n identical protons. This splitting is also equal to the scalar coupling, $J_{CH}$, that is observed in the proton spectrum. Identifying the same splits in the two different spectra will pin-point the protons that are scalarly coupled to a specific carbon.

The main step of performing the NMR spectroscopy (b) in this embodiment comprises the steps of:

100: Record a first one-dimensional spectrum for a first nuclear spin species ($^1H$) in the sample;

110: Record a second one-dimensional spectrum for a second nuclear spin species ($^{13}C$) in the sample.

The main step of comparing (c) in the present embodiment of the invention comprise the steps of:

120: identifying in the first spectra singlet peaks and corresponding doublets;

130: correlating peaks (group of peaks) in the two spectra by comparing and identifying the same splitting, whereby determining which protons are scalarly coupled to a specific carbon.

This embodiment of the invention fulfils the requirement imposed by the hyperpolarization in that the pulse sequence only comprises one pulse per NMR active nuclei. The time needed for the spectroscopy step may be kept very short, preferably less than 10 s.

The complete analysing process may preferably be automated and computer controlled through a computer program product. The process may be fully automated in all steps, but may also, if appropriate, involve an operator. The program may for example compute all peak values and the value of the splits between adjacent peaks, and an operator may perform the matching of peaks (doublets) between the different spectra.

Experimental Example

OX063 was dissolved in HP002 to give a 15 mM radical concentration. The solution was dripped into liquid nitrogen and beads of approximately 1.5 mm diameter were formed. After polarization for 2 hours at 1.1 K and 3.35 T using microwaves close to 94 GHz, the sample was dissolved in hot water in situ inside the polarizing unit. The formed solution was transferred to a 5 mm NMR tube which was manually transported to a 9.4 T spectrometer. Two consecutive one-pulse spectra were recorded, one $^{13}$C-spectrum and one $^{1}$H-spectrum. Time between dissolution and detection was estimated to 13 sec.

Due to the short relaxation time of $^{1}$H in this experiment, it will essentially only be $^{13}$C that retains its hyperpolarized state at the time of detection. The proton spectrum will thus consist mainly of a part that has been polarized thermally at the ambient temperature and field inside the detection magnet of the spectrometer. Due to dipolar couplings between $^{1}$H and $^{13}$C there will be a transfer of longitudinal magnetization from $^{13}$C to $^{1}$H that can be attributed to the Nuclear Overhauser Effect (NOE). This will affect only those molecules (1.1%) that contain $^{13}$C, but it is nevertheless an observable effect in the proton spectrum because of the large initial $^{13}$C polarization. The proton signal arising from the NOE will be in anti-phase with its thermal equilibrium signal, which in fact simplifies the interpretation of the spectrum. The doublet in FIG. 1a at 1175 Hz has a split of 143.3 Hz and the doublet at −26 Hz a split of 163.0 Hz. In the $^{13}$C spectrum (FIG. 1b) one observes a splitting of the signal due to the scalar coupling with $^{1}$H, having n+1 peaks when the carbon is coupled to n identical protons. In FIG. 1b two $^{13}$C triplets are observed, indicating a coupling to two identical $^{1}$H for each $^{13}$C nucleus. At 6536 Hz a split equal to 143.3 Hz is observed and at 762 Hz a split equal to 162.3 Hz. This observation leads to the conclusion that the $^{1}$H at 1175 Hz are scalarly coupled to the $^{13}$C at 6536 Hz with a coupling equal to 143.4 Hz. A similar identification can be made for the other $^{1}$H/$^{13}$C pair.

Heteronuclear Shift Correlation Spectroscopy for Hyperpolarized Samples

In a second embodiment, described with reference to FIG. 2a-b, the method according to the invention is adapted for heteronuclear shift correlation spectroscopy of a hyperpolarized sample.

Selective decoupling can be used to correlate chemical shifts between hetero nuclei that are connected by scalar coupling (J coupling). The basic principle of the embodiment is to make an array of (selective) decoupling frequencies in the domain of one of the nuclei and to observe the effect in the frequency domain of the other nuclei.

The embodiment comprises to selectively irradiate the resonances of a spin species I, e.g. $^{1}$H, in order to decouple them from a hetero nucleus (spins S), e.g. $^{13}$C, and monitor the effect on the spectrum of the S nuclei. When the decoupler frequency coincides with the resonance of a peak in the spin I spectrum, a collapse of the splits of resonances in the S spin spectrum will occur for those nuclei to which it is scalarly coupled. Two different approaches for the decoupling can be envisaged, one is to step the decoupler offset in small increments through the entire spectrum of the I spins, and the other is to step the decoupler through the known frequencies in the spectrum of the I spins. The effect of the decoupling, in the spectrum of the S nucleus, will be monitored between two consecutive decouplings. In both cases a spectrum of the spins I will first be acquired before the decoupling procedure takes place. In the first approach information can be obtained from the residual couplings. The partial decoupling leads to a scaling of the splitting of the multiplets in the S spin spectrum, depending on the resonance offset. This kind of off-resonance decoupling has been used extensively to assign complicated $^{13}$C spectra. The second approach requires an automatic Fourier transformation of the FID and a subsequent "peak-picking" in order to identify the array of decoupling frequencies that will be used in the experiment.

Furthermore there are two different methods of repeating the experiment for different decoupler offsets. In a first alternative of the embodiment, illustrated in FIG. 2a, a small flip angle approach is used that enables the experiment to be repeated the required number of times, equal to the length of the predefined array of decoupler frequencies. By use small flip angles the hyperpolarization will be, at least partly, preserved. The flip angles can optionally be tailored so as to take relaxation into account, and thus provide the same magnetization in the transverse plane during each cycle.

In a second alternative of the embodiment, illustrated in FIG. 2b, a 90 degree pulse transfers the entire magnetization of the S spins to the transverse plane, and a train of refocusing pulses (spin echo pulses) are then employed on the S nuclei that produces a train of spin echoes. During each spin echo a different decoupler frequency is used and the signal of the S spins can be monitored. A series of spectra is thus acquired corresponding to the different settings of the decoupler frequency. When the transverse relaxation time, $T_2$, is long the second alternative of the embodiment is to be preferred, whereas the first alternative has the advantage of not being so dependent on a long $T_2$.

This method is however not restricted to monitoring the coupling between protons and only one species of spins S. If the sample has a spin system consisting of additional hetero nuclei (e.g. $^{15}$N), as is frequently the case in organic molecules, the same manoeuvre can be performed for these nuclei, provided that multiply tuned NMR probes are available. The spin echo pulse sequences for the different S nuclei can be performed either consecutively or simultaneously. A single-shot detection of the connectivities between protons and different nuclear species then becomes possible.

The main step of performing the NMR spectroscopy (b) in this embodiment comprises the steps of:

200: Record a first spectra for the I nuclei ($^{1}$H) that is to be decoupled;

210: Perform a decoupling procedure on the I spins and simultaneously monitor the S spins spectra by:

210:1 subjecting the S nuclei to a pulse sequence comprising of a first 90° pulse which transfers the entire magnetization of the S spins to the transverse plane, and a subsequent train of refocusing pulses (spin echo pulses) During each spin echo a different decoupler frequency is used and the signal of the S nuclei is monitored;

or alternatively:

210:2 subjecting the S nuclei to a pulse sequence comprising a plurality of small flip angle pulses. The flip angle, α, may be different for each pulse. After each pulse a different decoupler frequency is used and the signal of the S nuclei is monitored.

The main step of analysing (c) in the present embodiment of the invention comprises the steps of:

220: using the first spectra for the I nuclei to determine frequency regions to be used in the decoupling procedure;

230: correlating the effects of decoupling in a specific frequency to the collapse of splits of resonances in the S spin spectrum, whereby determining which I nuclei are scalarly coupled to a specific S nuclei.

The pulse angle α may be chosen to be the same in subsequent repetitions of the loop, or it may be variable. For instance, the angle may be increased in each repetition such that an equal amount of transverse magnetization is created. Such a scheme would use the available magnetization most efficiently. The pulse angle is preferably increased according to a recursive formula, $\alpha(n+1) = \arcsin(\exp(\tau/T_1) \cdot \tan(\alpha(n)))$, wherein τ is the time between the excitation pulses and $T_1$ is the longitudinal relaxation time.

This embodiment of the invention fulfils the requirement imposed by the hyperpolarization in that the pulse sequence only comprises one 90° pulse per NMR active nuclei or, alternatively, a sequence of pulses with small flip angles. The time needed for the spectroscopy step may be kept very short, preferably less than 10 s.

Pulse Sequence for One-Shot J-Shift Spectra

Multidimensional NMR spectroscopy has emerged as a powerful tool for characterizing a molecule. As discussed above the pulse sequences commonly used in for example 2D NMR spectroscopy are not suited for use with hyperpolarized samples. Primarily, due to that the "standard" pulse sequences uses a plurality of flip pulses, while the hyperpolarization is lost after only one flip pulse. In a third embodiment of the present invention, described with reference to FIG. 3*a-b*, pulse sequences adapted for the hyperpolarized condition will be described. The embodiment is exemplified with a sequence which gives a 2D spectra, but the method according to the present invention may readily be adapted to multidimensional NMR spectroscopy.

A 2D NMR analysis typically follows the well-known experimental scheme: preparation-evolution-mixing-detection, in which the evolution phase starts with a 90° excitation pulse, and 180° pulses are used in the later phases. Due to the requirements set by the hyperpolarization a single-scan approach is imposed. In the following a system comprising spins S coupled to species of spin I will be studied. In practice a plurality of spins S will be present, but in the discussion below only one spin S is considered. The Hamiltonian of the spins system, with spins S and I is:

$$H = H_S + H_{IS} + H_I \tag{1}$$

with:

$$H_S = \delta_S S_z \text{ (In the rotating frame)}, \tag{2}$$

$$H_{IS} = S_z \left( \sum_i I_{iz} \right)$$

The following observations will be of main importance in developing a method suitable for hyperpolarized samples:

1. Periods of evolutions interspersed by 180° pulses can be constantly described by using different times for the evolution of the partial Hamiltonians, i.e. the density matrix at any given time can be written:

$$\sigma = \exp[-i(H_S t_S + H_{IS} t_{IS})]\sigma(0)\exp[i(H_S t_S + H_{IS} t_{IS})] \tag{3}$$

and the measured (complex) signal $\langle S_+ \rangle$ is equal to:

$$\langle S_+(t_S, t_{IS}) \rangle = Tr(\exp[i(H_S t_S + H_{IS} t_{IS})] S_+ \exp[-i(H_S t_S + H_{IS} t_{IS})]\sigma(0)) \tag{4}$$

The initial density matrix is chosen to be proportional to $S_x$, by applying a 90° pulse on S around Oy. All subsequent pulses on S will be around Ox, and will therefore not affect the form of σ(0).

2. The effect of the various pulses (always 180°) is the following:

$$I: t_S \to t_S; t_{IS} \to -t_{IS}$$

$$I,S: t_S \to -t_S; t_{IS} \to t_{IS}$$

$$S: t_S \to -t_S; t_{IS} \to -t_{IS} \tag{5}$$

3. During a period of free evolution between pulses, both times increase, and by equal amounts.

4. According to Eq. (4), signals corresponding to opposite values of both times are complex conjugates.

The prior-art methods utilizing a single scan, for example as described in "Non-Cartesian sampling schemes and acquisition of 2D NMR correlation spectra from single-scan experiments" by L. Frydman and J. Peng, Chem. Phys. Let., 220: 371-77, 1994, have not been adapted to address the requirements arising from the use of a hyperpolarized sample. In addition the prior art methods use trajectories in the $t_S$–$t_{IS}$ plane that do not fully span the area of interest. Hence valuable information may be lost in subsequent analysing steps. The pulse sequences according to the embodiment of the present invention are intended to fully utilize the advantage afforded by the hyperpolarized sample as well as to use an efficient trajectory in the $t_S$–$t_{IS}$ plane. They are intended to produce a square array of observed points in a square portion of the two-time space, so as to get all peaks in pure absorption.

First Sequence of the Third Embodiment

The first alternative sequence of the embodiment takes advantage of point 4, in that when one observes a point for given values $t_S, t_{IS}$, one does not observe the point with opposite values of these times, and deduces its value from the complex conjugate of the former one. A time interval τ between the different points are chosen, and one wants to fill a square extending from −N to +N times this unit time in both dimensions. It is assumed that points can observed not only between pulses but also just before and just after a pulse. The notation for a point of coordinates $t_S = i\tau, t_{IS} = j\tau$ is (i,j). The sequence comprises the following steps, which are to be included in the second main step (b) of the method according to the invention:

300: Starting from the point (0,0), with an 90° pulse on S, observe N+1 points (i,i) up to point (N,N).

305: Perform a pulse I (i.e. 180° on I), which leads to (N,−N).
310: Wait one time unit, leading to (N+1,−N+1).
315: Perform a pulse IS (a 180° pulse on both I and S), leading to (−N−1,−N+1).
320: Observe points up to (N−2,N).
325: Perform a pulse I, leading to (N−2,−N).
330: Observe points up to (N+1,−N+3).
335: Perform a pulse IS, etc . . .

Figure 3A:
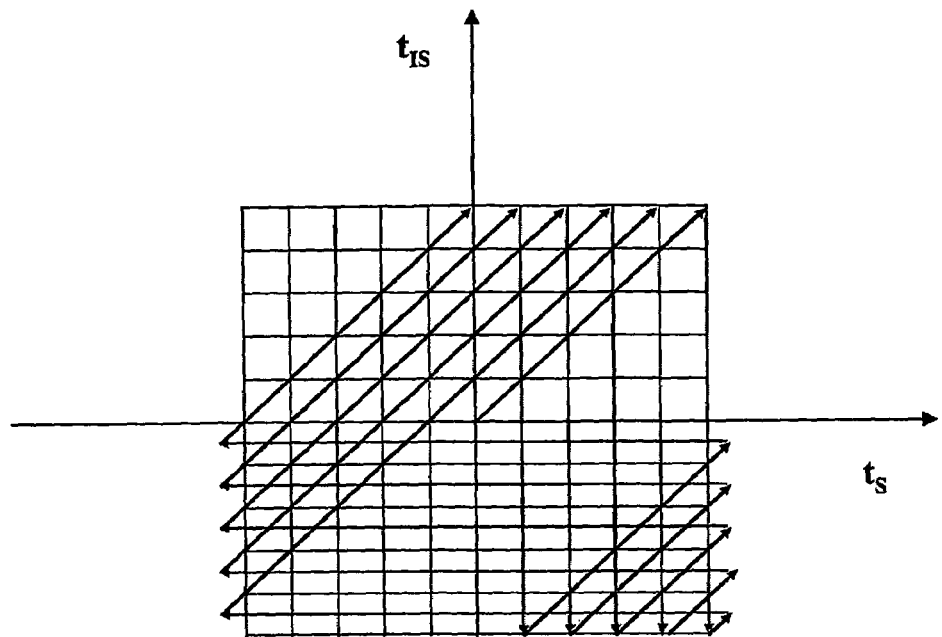
FIG. 3a-b illustrates trajectories in a two dimensional space, used by the pulse sequence according to a third embodiment of the present invention.

The resulting whole trajectory is depicted in FIG. 3a. After filling the holes according to point 4, one obtains only half the points of the grid in the form of a face-centered square array, and the missing one are obtained by interpolation from 4 points, so as to get a square array of points extending from −N to +N for ts and from (N−1) to +(N−1) for $t_{IS}$ (there are only three observed points at the upper and lower edges).

The total duration of the sequence is equal to N(N+1)τ. If for example N=100, and a reasonable duration for the sequence is, say, 1.5 s, which corresponds to τ=150 µs, that is, a spectral width $\Delta v = 1/(2\pi\tau) \approx 1.06$ kHz. The value $t_{Smax} = t_{Ismas} = 0.015$ s yields a spectral resolution $\delta v \approx 10.6$ Hz.

The actual time of observation of the various points according to this first sequence is far longer than $t_S + t_{IS}$, and since the relaxation decay is substantial during the whole sequence, one expects peak distortions in the final spectrum. In certain cases an appropriate correction of the data will be needed.

Second Sequence of the Third Embodiment

The second sequence of the third embodiment aims to make observations in the whole grid in the $t_S - t_{IS}$ plane. The first five steps are the same as in the first sequence, leading to the point (N−2,N). The sequence, which is to be included in the second main step (b) of the method according to the invention, comprises the steps of:

300b: Starting from the point (0,0), with an 90° pulse on S, observe N+1 points (i,i) up to point (N,N).
305b: Perform a pulse I (i.e. 180° on I), which leads to (N,−N).
310b: Wait one time unit, leading to (N+1,−N+1).
315b: Perform a pulse IS, leading to (−N−1,−N+1).
320b: Observe points up to (N−2,N).
340b: Perform a pulse S, which reverses both time signs and leads to (−N+2,−N).
345b: Observe points up to (N,N−2).
350b: Perform a pulse I leading to (N,−N+2).
355b: Observe points up to (N+1,−N+3).
360b: Perform a pulse I, leading to (−N−1,−N+3), etc. . . . (repeating steps 350-355)
365b: When in (N,−), it is possible to apply a I pulse, leading to (−N,−N) and observe points up to (0,0), thus completing the filling of the grid. Here again, the observation point being made at quite different times and affected by different relaxation decays, it would be necessary to treat the signals so as to avoid distortions in their Fourier transforms.

Figure 3B:
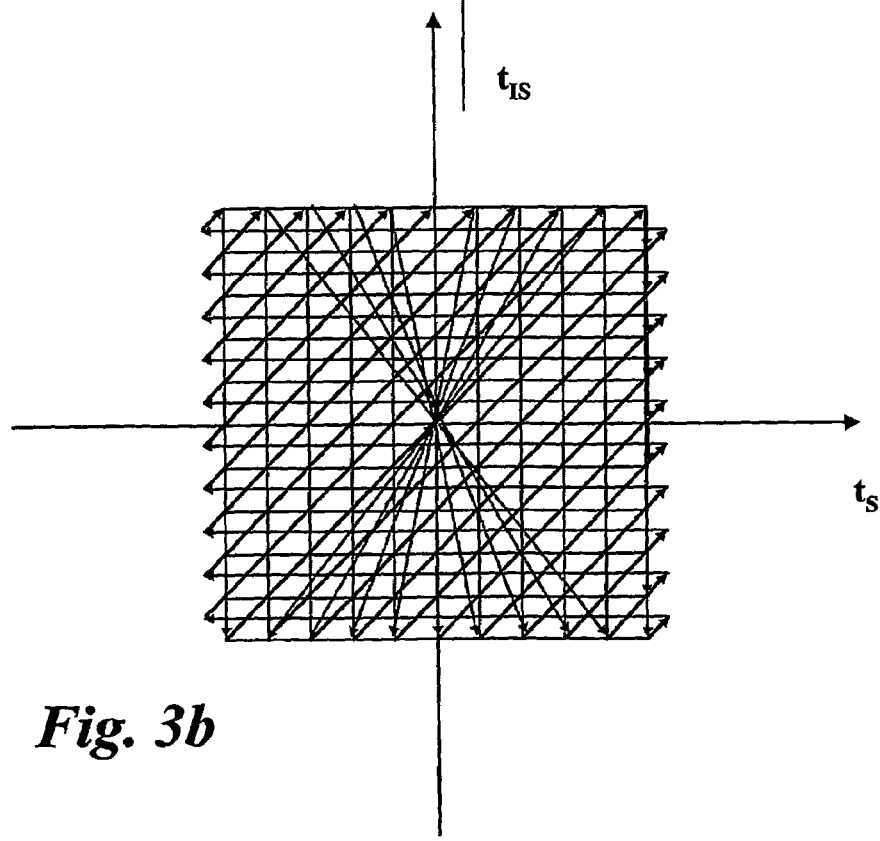

The resulting trajectory is depicted in FIG. 3b.

The duration of the second sequence is twice as long (2N(N+1)) as the first, which may cause problems with relaxation. This problem can be addressed by using a time interval between observed points twice shorter than above.

A common feature of both sequences is that the "time" interval between points is the same in both dimensions, and that the number of points is also the same, to within one unit.

As regards to the use of the J-shift spectra, thus produced, a preferred embodiment is to make two of them: one by observing the spins S and one by observing the spins I, and to correlate their respective chemical shifts from the equality of their respective heteronuclear J values.

This correlation is preferably comprised in the main analyzing step (c) of the method according to the invention.

The embodiment of the invention has been exemplified with a sequence which gives a 2D spectra, but the pulse sequence may be adapted to multidimensional NMR spectroscopy. In such an extension the time-space grid will be multidimensional giving a multidimensional frequency space, when analysed with for example Fast Fourier Transforms (FFT). As with the 2D case, care should be taken to chose a trajectory in the time-space grid that effectively spans all parts of the space (area, volume, etc) needed for the analysis.

Single-Shot Diffusion Weighted Sequences for Hyperpolarized In Vitro NMR

Diffusion-weighted NMR spectroscopy is known to yield information about for example ligand-protein interaction. However, using hyperpolarized samples, ordinary NMR techniques have, due to the previously discussed reasons, only limited applicability for in vitro diffusion-weighted NMR spectroscopy.

In a fourth embodiment of the present invention the pulse sequences suitable for diffusion-weighted NMR spectroscopy are adapted for use on a hyperpolarized sample. Similarly to the above described embodiments only one 90° flip pulse is used, followed by a plurality of spin echo pulses in a single scan approach. The use of multi-echo NMR sequences permits the acquisition of several spectra with progressive diffusion attenuation during a single run of the sequence. This enables for example rapid measurement of the diffusion coefficients of hyperpolarized ligands in the presence of potential target molecules.

Diffusion-weighted NMR has become a widely used methodology. As one example, diffusion of water molecules in tissue provides a contrast mechanism in Magnetic Resonance Imaging (MRI) that is linked to tissue microstructure. Diffusion-weighted NMR spectroscopy can also help to identify the degrees of freedom of a molecule in solution. For instance, the diffusion coefficient of a molecule is reduced upon adsorption of the molecule to a surface or to a macromolecule. So-called Diffusion Ordered Spectroscopy (DOSY) can thus yield information about ligand-protein binding.

A well known pulse sequence used for diffusion-weighted NMR spectroscopy is known as the pulsed gradient spin echo (PGSE) and is a 90°-τ-180°-τ spin echo sequence with gradient pulses. Duration and amplitude of the gradients determines the degree of diffusion weighting.

The PGSE sequence is run several times with different diffusion weighting. The reduction of the individual spin echoes versus diffusion weighting parameter b (a function of gradient strength, duration and timing) yield the value of the diffusion coefficient D.

For hyperpolarized samples, 90° pulses should be used with caution as they flip all the available magnetization into the transverse plane. But even if low flip angles are used, each run of the PGSE sequence will only yield one of several data points necessary for computing diffusion coefficient. Therefore, it is worth considering approaches either based on small flip angles or on multiple refocusing of the magnetization that yield the same information in a single scan as several runs of the PGSE sequence with different diffusion weighting. Such approaches will be exemplified below.

A known sequence commonly known as BURST is based on a train of low flip angle pulses during which a constant field gradient is applied. A 180° pulse flips the magnetization, and a train of spin echoes (again in the presence of the same gradient) is recorded. The j-th spin echo is caused by the (n−j−1)-th pulse (with n being the total number of pulses). The first sequence has been used successfully to measure diffusion of a hyperpolarized species, for example hyperpolarized $^{129}$Xe in different liquids. However, a disadvantage of the sequence is that it compromises the chemical shift information contained in the NMR spectrum. Therefore, this sequence should preferably by used only for diffusion measurements if a single intense peak is present in the NMR spectrum.

Figure 4:
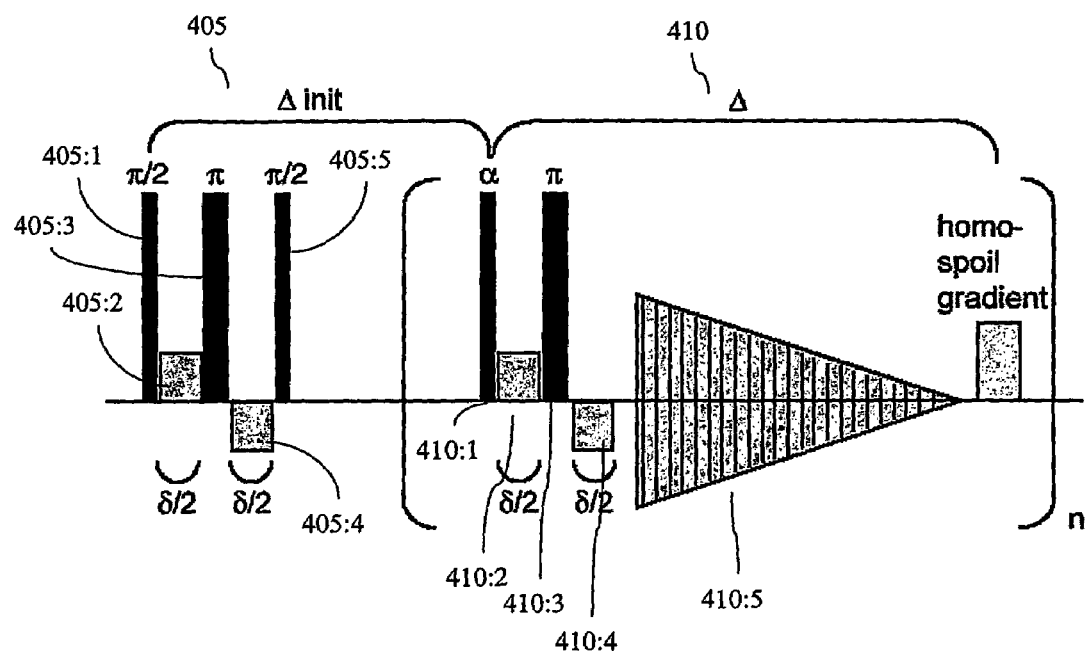
FIG. 4 is a schematic illustration of a pulse sequences according to a fourth embodiment of the present invention.

A sequence according to this embodiment which retains all chemical shift information is illustrated in FIG. 4. It is a multi-decoding extension of the established BPPSTE (bipolar pulse pair stimulated echo) sequence. This sequence, like the above, creates a train of diffusion-attenuated echoes. Unlike the first, however, no gradients are applied during the recording of the FID, and the chemical shift information of the 1D NMR spectrum is fully retained. This permits the measurements of individual diffusion coefficients for all peaks in the spectrum, which could be very useful when the sample contains e.g. several different ligands. Similar sequences have been described (for example the sequence known as Difftrain), but without addressing the requirements raised by the use of a hyperpolarized sample. The main step of performing the NMR spectroscopy (b) in this embodiment comprises the step of:

405: An initial phase, run only once per sequence which comprises;
  405:1: a first 90° pulse;
  405:2: applying a gradient field with a first orientation;
  405:3: a first 180° pulse;
  405:4: applying a gradient field with a second orientation opposite the first;
  405:5: a second 90° pulse.
410: spin-echo acquisition phase that will be repeated n times comprising:
  410:1: a pulse with angle α;
  410:2: applying a gradient field with a first orientation;
  410:3: a 180° spin-echo pulse;
  410:4: applying a gradient field with a second orientation opposite the first;
  410:5: recording the FID;

The main step of analysing (c) in the present embodiment of the invention comprises the step of:

420: The n recorded spectra, or a portion of them, are compared. From the attenuation of the spin echos a value of the diffusion coefficient D is derived.

The first 90° and 180° pulses (separated by a time τ) give rise to a spin echo at time 2τ. Exactly at this time another 90° pulse is applied. The magnetisation is thus "stored" along the z-axis, i.e. the state created after the second 90° pulse will be subject to $T_1$ relaxation and not $T_2$ relaxation. This is particularly advantageous if $T_1$ is long. The bipolar gradient pair (symmetric with respect to the 180° pulse) provides the "diffusion encoding".

The loop displayed in the figure consists of a pulse of pulse angle α<<90°, followed by a 180° pulse, and another bipolar pair of field gradients. The α pulse serves the purpose to slightly perturb the state created by the initial pulses. For the purpose of repeating the loop by generating more than one echo, it is important the flip angle be much smaller than 90° in order to leave sufficient magnetization in the z-direction for the subsequent echoes. The pulse angle α may be chosen to be the same in subsequent repetitions of the loop, or it may be variable. For instance, the angle α may be increased in each repetition such that an equal amount of transverse magnetization is created, and such that the last α pulse is a 90° pulse.

Such a scheme would use the available magnetization most efficiently. The 180° pulse following the α pulse again serves the purpose of creating a spin echo. This spin echo is detected by the receiver of the NMR spectrometer. The Fourier transform of this echo yields the NMR spectrum.

The second bipolar gradient pair has the purpose of "rewinding" the effect of the first pair. This means that an ensemble of spins that was de-phased under the influence of the initial gradient pulses will now experience the same amount of re-phasing. This, however, only applies for a static spin ensemble. If the spins have moved during the time between the first and the second gradient pair, $\Delta_{init}$, due to molecular diffusion, then the second gradient pair will not fully compensate the de-phasing. Thus, the amplitude of the echo will be decreased accordingly, and the degree of attenuation will depend on the gradient strength and duration, the NMR pulse sequence timing (in particular $\Delta_{init}$) and on the diffusion coefficients of the nuclear spins (i.e. the corresponding molecules containing the NMR-sensitive nuclear spins). This is the principle of performing diffusion measurements using NMR. The corresponding "peak" in the NMR spectrum will reflect this attenuation. If there is more than one NMR-"visible" molecular species in the sample, and if the different molecules have different diffusion coefficients, then the corresponding peaks in the NMR spectrum will be attenuated to a different degree. Thus, it is possible to distinguish species according to their respective degree of diffusion.

For subsequent repetitions of the loop, the relevant time between application of the initial field gradient pair and the pair before reading out the corresponding echo will be greater than $\Delta_{init}$. For the n-th echo, this time will be $\Delta_n = \Delta_{init} + (n-1) \cdot \Delta$, leading to a different degree of attenuation due to molecular diffusion. The diffusion coefficient can then be calculated from the "envelope" of the NMR signal intensities of each peak in the spectrum plotted as a function of $\Delta_n$.

As briefly mentioned above, the state created by the initial 90°-180°-90° pulses is also subject to so-called spin-lattice relaxation or $T_1$ relaxation. This needs to be taken into account when calculating the diffusion coefficient. If, however, $T_1$ is very long compared to the time scale of the NMR pulse sequence, then the attenuation of the NMR signal(s) due to $T_1$ relaxation is negligible.

The attenuation of the echoes is due to both $T_1$ relaxation and diffusion. In order to distinguish the two mechanisms, the second sequence can be run twice—once without gradients, and once with diffusion gradients. Apart from serving as a reference scan for the diffusion measurement, the second sequence without gradients can be regarded as a single-scan $T_1$ measurement as well. However, $T_1$ relaxation times of hyperpolarized species are readily obtained by a series of low flip-angle pulses. If the second sequence is short enough to preserve some hyperpolarized magnetization, the low flip-angle $T_1$ sequence may be run immediately following the second sequence.

The ligand could be enriched in e.g. $^{13}$C or $^{15}$N in any position. The choice of position can be made purely on the basis of maximizing the local $T_1$ relaxation time, as the diffusion constant of the entire ligand is affected upon binding to a target. Indeed, it may be favorable to choose a site of enrichment whose relaxation properties are not affected when binding takes place. This relative freedom in deciding on enrichment position is a potential advantage of the diffusion-based assessment of binding over other NMR methods that rely on changes in relaxation times or chemical shift and may thus suffer from accelerated destruction of hyperpolarized magnetization during the measurement.

In the above embodiments a number of examples have been given of how to design and adapt pulse sequences to fully utilize the increased sensitivity afforded by hyperpolarization of a sample. As should be apparent for the skilled man, other pulse sequences used in various types of NMR spectroscopy and imaging also could advantageously be adapted in similar ways to be used with hyperpolerized samples. Of special interest are the comparably rapid advanced NMR methods that have recently been suggested, for example as described in "The acquisition of multidimensional NMR spectra within a single scan" by L. Frydman et al, Prac. Natl. Acad. Sci., 99:15858-62, Dec. 10, 2002. This method uses an imaging gradient to partition the samples in a plurality (tens or hundreds) of spatially localized portions, or slices. Each slice is subjected to a single NMR scan, and the signal from all slices are monitored simultaneously. This approach effectively compresses a multidimensional experiment into one scan and dramatically reduces the measurement time. This method, and other single scan methods, represent major improvements regarding measurement time, but has a drawback in poor signal-to-noise ratio, requiring the use of highly sensitive instruments. In these cases the use of hyperpolarized samples will be very advantageous, as the increased signal strength from the hyperpolerized sample will give an essential improvement in the signal-to-noise ratio. The novel rapid methods need, as exemplified in the above embodiments, to meet the requirements set by the hyperpolarization.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the scope of the appended claims.

The invention claimed is:

1. A method of performing two-dimensional Nuclear Magnetic Resonance (NMR) spectroscopy on a hyperpolarized sample, which method comprises the steps of:

hyperpolarizing a sample which comprises a first nuclear species (I) and a second nuclear species (S), with the Hamiltonian $H=H_S+H_{IS}+H_I$ using DNP, wherein the NMR active nuclei receive hyperpolarization and transformation of the sample to a liquid state;

performing two-dimensional NMR spectroscopy on the sample and thereby producing at least two NMR spectra with the use of a sequence of rf-pulses, wherein the sequence of rf-pulses comprises at least two rf-pulses on the same nuclei, and wherein the pulse sequence is adapted for a hyperpolarized sample in such a way that it uses a single scan, an efficient trajectory in a $t_S$-$t_{IS}$ plane and produces a square array of observed points in a square portion of a two time space;

analyzing the at least two NMR spectra in order to obtain a characterization of the sample.

2. The NMR spectroscopy method according to claim 1, wherein the pulse sequence spans a trajectory in a two-dimensional evolution time space ($t_S$, $t_{IS}$), said pulse sequence comprises the step of:

(300) starting from the point (0,0), with an 90° pulse on S, observing N+1 points (i,i) up to point (N,N);
(305) performing a 180° pulse on I, which leads to (N,−N);
(310) waiting one time unit, leading to (N+1,−N+1);
(315) performing a 180° pulse on both I and S, leading to (−N−1,−N+1);
(320) observing points up to (N−2,N);
(325) performing a 180° pulse on I, leading to (N−2,−N);
(330) observing points up to (N+1,−N+3).

3. The NMR spectroscopy method according to claim 1, wherein the pulse sequence spans a trajectory in a two-dimensional evolution time space ($t_S$, $t_{IS}$), said pulse sequence comprises the step of:

(300b) starting from the point (0,0), with an 90° pulse on S, observing N+1 points (i,i) up to point (N,N);
(305b) performing a 180° pulse on I, which leads to (N,−N);
(310b) waiting one time unit, leading to (N+1,−N+1);
(315b) performing a 180° pulse on both I and S, leading to (−N−1,−N+1);
(320b) observing points up to (N−2,N);
(340b) performing a 180° pulse on S, which reverses both time signs and leads to (−N+2,−N);
(345b) observing points up to (N,N−2);
(350b) performing a 180° pulse on I leading to (N,−N+2);
(355b) observing points up to (N+1,−N+3).

4. A method of performing two-dimensional Nuclear Magnetic Resonance (NMR) spectroscopy on a hyperpolarized sample, which method comprises the steps of:

hyperpolarizing a sample which comprises a first nuclear species (I) and a second nuclear species (S), with the Hamiltonian $H=H_S+H_{IS}+H_I$ using DNP, wherein the NMR active nuclei receive hyperpolarization and transformation of the sample to a liquid state;

performing two-dimensional NMR spectroscopy on the sample and thereby producing at least two NMR spectra with the use of a sequence of rf-pulses, wherein pulse sequence comprises at least two rf-pulses on different nuclei, and wherein pulse sequence is adapted for a hyperpolarized sample in such a way that it uses a single scan, an efficient trajectory in a $t_S$-$t_{IS}$ plane and produces a square array of observed points in a square portion of a two time space,;

analyzing the at least two NMR spectra in order to obtain a characterization of the sample.

5. The NMR spectroscopy method according to claim 4, wherein the pulse sequence spans a trajectory in a two-dimensional evolution time space ($t_S$, $t_{IS}$), said pulse sequence comprises the step of:

(300) starting from the point (0,0), with an 90° pulse on S, observing N+1 points (i,i) up to point (N,N);
(305) performing a 180° pulse on I, which leads to (N,−N);
(310) waiting one time unit, leading to (N+1,−N+1);
(315) performing a 180° pulse on both I and S, leading to (−N−1,−N+1);
(320) observing points up to (N−2,N);
(325) performing a 180° pulse on I, leading to (N−2,−N);
(330) observing points up to (N+1,−N+3).

6. The NMR spectroscopy method according to claim 4, wherein the pulse sequence spans a trajectory in a two-dimensional evolution time space ($t_S$, $t_{IS}$), said pulse sequence comprises the step of:

(300b) starting from the point (0,0), with an 90° pulse on S, observing N+1 points (i,i) up to point (N,N);
(305b) performing a 180° pulse on I, which leads to (N,−N);
(310b) waiting one time unit, leading to (N+1,−N+1);
(315b) performing a 180° pulse on both I and S, leading to (−N−1,−N+1);
(320b) observing points up to (N−2,N);
(340b) performing a 180° pulse on S, which reverses both time signs and leads to (−N+2,−N);
(345b) observing points up to (N,N−2);
(350b) performing a 180° pulse on I leading to (N,−N+2);
(355b) observing points up to (N+1,−N+3).

* * * * *